(12) United States Patent
Höfle et al.

(10) Patent No.: US 9,960,390 B2
(45) Date of Patent: May 1, 2018

(54) METHOD OF PRODUCING AN OPTOELECTRONIC DEVICE AND OPTOELECTRONIC DEVICE

(71) Applicant: OSRAM OLED GmbH, Regensburg (DE)

(72) Inventors: Stefan Höfle, Karlsruhe (DE); Alexander Colsmann, Karlsruhe (DE); Manuel Reinhard, Karlsruhe (DE); Uli Lemmer, Karlsruhe (DE)

(73) Assignee: OSRAM OLED GmbH (DE)

( * ) Notice: Subject to any disclaimer, the term of this patent is extended or adjusted under 35 U.S.C. 154(b) by 121 days.

(21) Appl. No.: 14/914,062

(22) PCT Filed: Aug. 27, 2014

(86) PCT No.: PCT/EP2014/068188
§ 371 (c)(1),
(2) Date: Feb. 24, 2016

(87) PCT Pub. No.: WO2015/007920
PCT Pub. Date: Jan. 22, 2015

(65) Prior Publication Data
US 2016/0204388 A1      Jul. 14, 2016

(30) Foreign Application Priority Data

Aug. 30, 2013  (DE) .................. 10 2013 109 451

(51) Int. Cl.
*H01L 51/56* (2006.01)
*H01L 51/52* (2006.01)
*H01L 51/00* (2006.01)

(52) U.S. Cl.
CPC ...... *H01L 51/5278* (2013.01); *H01L 51/0028* (2013.01); *H01L 51/5206* (2013.01); *H01L 51/5221* (2013.01); *H01L 2251/303* (2013.01)

(58) Field of Classification Search
None
See application file for complete search history.

(56) References Cited

U.S. PATENT DOCUMENTS

| | | | |
|---|---|---|---|
| 2010/0289010 A1* | 11/2010 | Cho | H01L 51/5036 257/40 |
| 2012/0193619 A1 | 8/2012 | Taka et al. | |
| 2015/0053966 A1 | 2/2015 | Steiger et al. | |

FOREIGN PATENT DOCUMENTS

| | | |
|---|---|---|
| DE | 10 2012 007 810 A1 | 11/2012 |
| DE | 10 2011 084 145 A1 | 4/2013 |

(Continued)

OTHER PUBLICATIONS

Höfle et al., Adv. Mater. 2014, 26, 5155-5159.*

(Continued)

*Primary Examiner* — Vu A Nguyen
(74) *Attorney, Agent, or Firm* — DLA Piper LLP (US)

(57) ABSTRACT

A method of producing an optoelectronic device includes A) providing a substrate, B) applying a first electrode to the substrate, C) applying a first organic layer stack to the first electrode, D) producing a charge-generating layer stack on the first organic layer stack, E) applying a second organic layer stack to the charge-generating layer stack, and F) applying a second electrode to the second organic layer stack, wherein step D) includes D1) applying a solution of a first metal oxide precursor to the first organic layer stack, D2) generating a first charge-generating layer comprising a first metal oxide, D3) applying a solution of a second metal oxide precursor to the first charge-generating layer, and D4) generating a second charge-generating layer comprising a second metal oxide.

14 Claims, 2 Drawing Sheets

(56) References Cited

FOREIGN PATENT DOCUMENTS

| EP | 2 309 824 A1 | 4/2011 |
|---|---|---|
| JP | 2008-294356 A | 12/2008 |
| WO | 2012/041845 A1 | 4/2012 |
| WO | 2012/076836 A1 | 6/2012 |
| WO | 2012/175925 A1 | 12/2012 |

OTHER PUBLICATIONS

Puetz et al. (Organic Electronics 2012, 13, 2696-2701).*
Zilberberg et al. (Advanced Energy Materials 2011, 1, 377-381).*
Höfle et al. (Organic Electronics 2013, 14, 1820-1824).*
M.-H. Ho, et al., "Highly efficient p-i-n white organic light emitting devices with tandem structure", *Applied Physics Letters*, 2007, vol. 91, pp. 233507.
P. de Bruyn, et al., "All-solution processed polymer light-emitting diodes with air stable metal-oxide electrodes", *Organic Electronics*, 2012, vol. 13, pp. 1023-1030.
S. Hamwi, et al., "The Role of Transition Metal Oxides in Charge-Generation Layers for Stacked Organic Light-Emitting Diodes", *Advanced Functional Materials*, 2010, vol. 20, pp. 1762-1766.
K. Zilberberg, et al., "Inverted Organic Solar Cells with Sol-Gel Processed High Work-Function Vanadium Oxide Hole-Extraction Layers", *Advanced Functional Materials*, 2011, vol. 21, pp. 4776-4783.
M. Nakamura, et al., "High-performance polymer photovoltaic devices with inverted structure prepared by thermal lamination", *Solar Energy Materials & Solar Cells*, 2009, vol. 93, pp. 1681-1684.
T. Kuwabara, et al., "Highly durable inverted-type organic solar cell using amorphous titanium oxide as electron collection electrode inserted between ITO and organic layer", *Solar Energy Materials & Solar Cells*, 2008, vol. 92, pp. 1476-1482.
J. Y. Kim, et al., "New Architecture for High-Efficiency Polymer Photovoltaic Cells Using Solution-Based Titanium Oxide as an Optical Spacer", *Advanced Materials*, 2006, vol. 18, pp. 572-576.
S. Höfle, et al., "Molybdenum oxide anode buffer layers for solution processed, blue phosphorescent small molecule organic light emitting diodes", *Organic Electronics*, 2013, vol. 14, pp. 1820-1824.
S. Höfle, et al., "Tungsten Oxide Buffer Layers Fabricated in an Inert Sol-Gel Process at Room-Temperature for Blue Organic Light-Emitting Diodes", *Advanced Materials*, 2013, vol. 25, pp. 4113-4116.
S. K. Hau, et al., "Interfacial modification to improve inverted polymer solar cells", *Journal of Materials Chemistry*, 2008, vol. 18, pp. 5113-5119.
C.-P. Chen, et al., "High-Performance and Highly Durable Inverted Organic Photovoltaics Embedding Solution-Processable Vanadium Oxides as an Interfacial Hole-Transporting Layer", *Advanced Materials*, 2011, vol. 23, pp. 3859-3863.

* cited by examiner

METHOD OF PRODUCING AN OPTOELECTRONIC DEVICE AND OPTOELECTRONIC DEVICE

TECHNICAL FIELD

This disclosure relates to a method of producing an optoelectronic device and to an optoelectronic device.

BACKGROUND

Optoelectronic devices can be, e.g., solar cells or organic light-emitting devices. A plurality of light-emitting layers are arranged one on top of the other in organic light-emitting devices to achieve high luminous densities on large surfaces. By stacking the light-emitting layers one on top of the other, the required current densities are reduced approximately by half with the component efficiency being retained. Arranged between the light-emitting layers is typically a charge-generating layer stack, a so-called Charge Generation Layer (CGL). During operation of the organic light-emitting device, electron-hole pairs are generated and separated at the CGL and the electrons and holes are made available to the adjoining organic light-emitting layers. A CGL permits stacking of two light-emitting layers one on top of the other. This means that the CGL permits an electrically serial connection of two light-emitting layers deposited one on top of the other. A charge-generating layer stack (CGL) between two light-emitting layers thus comprises a plurality of partial layers. These partial layers of a multi-layer charge generation layer have thus far been deposited by vaporization of the materials in a vacuum and this is associated with a high level of process complexity and high costs.

Therefore, it could be helpful to provide a method of producing an optoelectronic device with, proportionally speaking, a low level of process complexity and low costs. It could also be helpful to provide an optoelectronic device having improved properties.

SUMMARY

We provide a method of producing an optoelectronic device including:
A) providing a substrate,
B) applying a first electrode to the substrate,
C) applying a first organic layer stack to the first electrode,
D) producing a charge-generating layer stack on the first organic layer stack,
E) applying a second organic layer stack to the charge-generating layer stack,
F) applying a second electrode to the second organic layer stack,
wherein method step D) includes:
D1) applying a solution of a first metal oxide precursor to the first organic layer stack,
D2) generating a first charge-generating layer comprising a first metal oxide,
D3) applying a solution of a second metal oxide precursor to the first charge-generating layer,
D4) generating a second charge-generating layer comprising a second metal oxide.

We further provide an optoelectronic device including a substrate, a first electrode on the substrate, a first organic layer stack on the first electrode, a charge-generating layer stack on the first organic layer stack, wherein the charge-generating layer stack includes a first charge-generating layer comprising ZnO and a second charge-generating layer comprising $V_2O_5$, a second organic layer stack on the charge-generating layer stack and a second electrode on the second organic layer stack.

We yet further provide a method of producing an optoelectronic device including:
A) providing a substrate,
B) applying an anode to the substrate,
C) applying a first organic layer stack to anode,
D) producing a charge-generating layer stack on the first organic layer stack,
E) applying a second organic layer stack to the charge-generating layer stack,
F) applying a cathode to the second organic layer stack,
wherein step D) includes:
D1) applying a solution of a first electron-conductive metal oxide precursor to the first organic layer stack, wherein the first electron-conductive metal oxide precursor has formula A or A':

where $R^1$, $R^2$, $R^3$, $R^4$, $R^5$ and $R^6$ can be selected to be the same or different and are selected from the group consisting of H and alkyl residues, $M^1$=Zn or Sn and n=1 or 2,
D2) generating a first charge-generating layer comprising a first metal oxide,
D3) applying a solution of a second electron-conductive metal oxide precursor to the first charge-generating layer, wherein the second electron-conductive metal oxide precursor has one of formulae B, C or D:

where in formula B:
$R^{1'}$, $R^{2'}$ and $R^{3'}$ can be selected to be the same or different and are selected from the group consisting of methyl-, ethyl-, n-propyl, i-propyl, n-butyl-, i-butyl, sec-butyl and tert-butyl residues and
$M^2$=V, Nb or Ta,
where in formula C:
$R^{1'''}$, $R^{2'''}$, $R^{3'''}$, $R^{4'''}$ and $R^{5'''}$ can be selected to be the same or different and are selected from the group consisting of methyl-, ethyl-, n-propyl, i-propyl, n-butyl-, i-butyl, sec-butyl and tert-butyl residues and
$M^3$=W or Mo,
and where in formula D:
$R^{1'''}$, $R^{2'''}$, $R^{3'''}$, $R^{4'''}$, $R^{5'''}$ and $R^{6'''}$ can be selected to be the same or different and are selected from the group consisting of methyl-, ethyl-, n-propyl, i-propyl, n-butyl-, i-butyl, sec-butyl and tert-butyl residues and
$M^4$=W or Mo,
D4) generating a second charge-generating layer comprising a second metal oxide.

DETAILED DESCRIPTION

We provide a method of producing an optoelectronic device comprising:
A) providing a substrate,
B) applying a first electrode to the substrate,
C) applying a first organic layer stack to the first electrode,
D) producing a charge-generating layer stack on the first organic layer stack,
E) applying a second organic layer stack to the charge-generating layer stack,
F) applying a second electrode to the second organic layer stack.
Method step D) comprises:
D1) applying a solution of a first metal oxide precursor to the first organic layer stack,
D2) generating a first charge-generating layer comprising a first metal oxide,
D3) applying a solution of a second metal oxide precursor to the first charge-generating layer,
D4) generating a second charge-generating layer comprising a second metal oxide.

This method can be used to produce, e.g., a solar cell or an organic light-emitting device.

The fact that a layer, a layer stack or an element is applied "on" or "over" another layer, another layer stack or another element may here and hereinafter mean that the one layer, the one layer stack or the one element is directly applied and formed in direct mechanical and/or electrical contact with the other layer, the other layer stack or the other element. It may moreover also mean that the one layer, the one layer stack or the one element is applied indirectly on or over the other layer, the other layer stack or the other element. Then, one or a plurality of further layers, layer stacks and/or elements can be applied between the one or other layer, the one or other layer stack or the one or other element.

The metal oxide precursor is defined here and hereinafter by a chemical compound that can undergo a chemical reaction as a starting material. The corresponding metal oxide is produced as the product of this reaction. Further educts can also be involved in the chemical reaction. Therefore, the metal oxide precursor is a starting material from which the desired metal oxide can be formed. For instance, a first metal oxide can be formed from the first metal oxide precursor and a second metal oxide can be formed from the second metal oxide precursor.

Charge-generating layers have previously been produced by vaporization of the corresponding materials. The use of metal oxides, preferably semiconductive metal oxides for charge-generating layers is desirable since they can conduct electrons and holes very effectively and they can also be obtained in a cost-effective manner. However, the vaporization of metal oxides in a vacuum and the deposition would be associated with a very high level of process complexity, inter alia through the use of specific vaporization apparatus and, as a result, would also be associated with high costs. On the other hand, metal oxides are frequently only very poorly soluble so that application from the liquid phase is not suitable. The use of metal oxide precursors that can be applied as a solution in the liquid phase permits a simple, efficient and cost-effective method of producing charge-generating layers comprising metal oxides. The metal oxide precursors are dissolved and applied to a layer. The chemical reaction of the metal oxide precursor produces the corresponding metal oxide. This method does not require any specific apparatus and/or aids, as is necessary for conventional vaporization of corresponding materials in a vacuum. Furthermore, application over a large surface, e.g., by printing methods or spin-coating is possible.

The first charge-generating layer formed in method step D2) may consist of the first metal oxide and/or the second charge-generating layer formed in method step D4) consists of the second metal oxide.

The first and/or the second metal oxide may be semiconductive.

The first and/or the second metal oxide may be n-conductive, i.e., electron-conductive. For example, the first and second metal oxides can be electron-conductive.

The first and/or second charge-generating layer(s) formed in method step D2) and/or method step D4) may be of low solubility. In particular, it is not soluble for the solutions with which the further layers are applied. Charge-generating layers consisting of a metal oxide can form a solvent barrier that prevents diffusing solvents required to apply further layers from damaging layers that lie thereunder or have been applied beforehand. Also, charge-generating layers comprising a metal oxide can form a solvent barrier that at least substantially prevents diffusing solvents required to apply further layers from damaging layers that lie thereunder or have been applied beforehand.

The method may comprise a further method step of: D') producing a second charge-generating layer stack on the second organic layer stack.

Method step D') can be performed after method step E). Method step D') can comprise the same method steps as method step D). All of the features of method step D) are thus also disclosed for method step D').

It is possible that in addition to the first and second charge-generating layer stacks, further charge-generating layer stacks are formed. All of the features of the production of the first and second charge-generating layer stacks can also apply to the further charge-generating layer stacks. The further charge-generating layer stacks are formed between two organic layer stacks.

The fact that a layer, an element or a layer stack is arranged "between" two other layers, elements or layer stacks, may here and hereinafter mean that the one layer, the one element or the one layer stack is arranged directly in direct mechanical and/or electrical contact or is arranged in indirect contact with the one of the two other layers, with elements or layer stacks and is arranged in direct mechanical and electrical contact or in indirect contact with the other of the two other layers, with elements or layer stacks. In the case of indirect contact, further layers and/or elements and/or layer stacks can then be arranged between the one layer and at least one of the two other layers or between the one element and at least one of the two other elements or between the one layer stack and at least one of the two other layer stacks.

Method step C) may comprise a method step C2) of applying a first light-emitting layer to the first electrode. Method step C) can also consist of method step C2). The first light-emitting layer can comprise a light-emitting material.

Method step E) may comprise a method step E2) of applying a second light-emitting layer on the charge-generating layer stack. Method step E) can also consist of method step E2). The second light-emitting layer can comprise a light-emitting material.

In method step D2), a first charge-generating layer may be generated which has a layer thickness of 3 to 50 nm, preferably 3 to 30 nm, particularly preferably 3 to 20 nm. Layer thicknesses of more than 50 nm are likewise feasible.

In method step D4), a second charge-generating layer may be generated which has a layer thickness of 3 to 50 nm, preferably 3 to 30 nm, particularly preferably 3 to 20 nm. Layer thicknesses of more than 50 nm are likewise feasible.

Such thin layer thicknesses of the first and/or second charge-generating layer can ensure that the charge transport extends in an optimum manner through the charge-generating layer stack and the first and second organic layer stack are supplied with electrons and holes. These layer thicknesses can also ensure that solvents used to apply further layers do not diffuse through the charge-generating layers and thus already formed layers are not damaged.

In method step D2), a transparent first charge-generating layer may be generated and/or in method step D4) a transparent second charge-generating layer may be generated. The term "transparent" means that a material or a layer is transmissive to the entire visible electromagnetic spectrum or a partial spectrum thereof. In addition, the material or the layer can also be at least partially transmissive to UV and/or IR radiation.

The transparency can be achieved by a first and second charge-generating layer comprising metal oxides having a large band gap. Alternatively or in addition, the transparency can be adapted by the layer thickness.

The solution of the first metal oxide precursor may be heated prior to method step D1), to a temperature of 20° C. to 60° C. and/or the solution of the second metal oxide precursor is heated, prior to method step D3), to a temperature of 20° C. to 60° C. Preferably, heating is carried out to a temperature of 30° C. to 60° C., e.g., to 40° C. or 50° C. Then, in method step D1) and/or D3) a solution is applied which has a temperature of 20° C. to 60° C., preferably a temperature of 30° C. to 60° C., e.g., 40° C. or 50° C. The term "heating" may here and hereinafter also include the possibility that the temperature of, e.g., the solution is maintained if it is already at room temperature. The term "room temperature" is intended here and hereinafter to be understood as a temperature of 20° C.

The first organic layer stack may be heated prior to method step D1) to a temperature of 20° C. to 60° C. and/or the first charge-generating layer is heated, prior to method step D3), to a temperature of 20° C. to 60° C. Preferably, heating is carried out to a temperature of 30° C. to 60° C., e.g., to 40° C. or 50° C. In method step D1) and/or D3), the solution of the first and/or second metal oxide precursor is thus applied to the first organic layer stack, which has a temperature of 20° C. to 60° C., e.g., 40° C. or 50° C., or the first charge-generating layer which has a temperature of 20° C. to 60° C., e.g., 40° C. or 50° C.

The solution of the first metal oxide precursor and the first organic layer stack may be heated to the same temperature prior to method step D1) and/or the solution of the second metal oxide precursor and the first charge-generating layer are heated to the same temperature prior to method step D3). In particular, heating is effected to a temperature of 50° C. The temperature indication applies within the scope of measuring accuracy. This can mean that the temperatures deviate from one another by 1 to 2° C. Identical temperatures can guarantee that in association with a homogeneous reaction a homogeneous or substantially homogeneous first and/or second charge-generating layer is generated.

The solution of the first metal oxide precursor and the first organic layer stack are at room temperature in method step D1) and/or the solution of the second metal oxide precursor and the first charge-generating layer are at room temperature in method step D3).

For example, the solution of the first metal oxide precursor can be at a temperature of 50° C. in method step D1) and the solution of the second metal oxide precursor can be at room temperature in method step D3).

The solution of the first metal oxide precursor may be applied in method step D1) by coating methods, spin-coating, spraying or printing methods and/or the solution of the second metal oxide precursor is applied in method step D3) by coating methods, spin-coating, spraying or printing methods.

The solution of the first metal oxide precursor applied by centrifugation in method step D1) by spin-coating and/or the solution of the second metal oxide precursor may be applied by centrifugation in method step D3) by spin-coating.

The centrifugal application may be performed for 30 seconds to 120 seconds, preferably 30 to 80 seconds and particularly preferably 50 seconds.

The centrifugal application can be performed at a rate of 1000 to 4000, preferably 2000 revolutions per minute.

The solution of the first metal oxide precursor may be filtered prior to method step D1) and/or the solution of the second metal oxide precursor is filtered prior to method step D3).

To filter the solution of the first metal oxide precursor and/or to filter the solution of the second metal oxide precursor, a 22 µm filter, in particular a Teflon filter can be used. A "22 µm filter" means that, during filtration, particles of a size greater than 22 µm remain as a residue in the filter. The filtrate and therefore the solution of the first and/or second metal oxide precursor do not have any particles larger than 22 µm. Therefore, agglomerates in the first and/or second charge-generating layer can be prevented or substantially prevented.

Generation of a first charge-generating layer comprising a first metal oxide may comprise, in method step D2), heating the solution of the first metal oxide precursor.

Generation of a second charge-generating layer comprising a second metal oxide may comprise in method step D4), heating the solution of the second metal oxide precursor.

By heating the solution of the first or second metal oxide precursor, the first metal oxide precursor or the second metal oxide precursor produces, by chemical reaction, the corresponding first or second metal oxide which each form the first and second charge-generating layers or are contained therein.

The chemical reaction in which the first or second metal oxide is produced from the first or second metal oxide precursor may be a hydrolysis reaction.

As byproducts, e.g., alcohols can be produced which vaporize at temperatures of 60° C. to 150° C.

Heating may produce not only the first and/or the second metal oxide, but also byproducts from the chemical reaction of the first and/or the second precursor.

The byproducts may be completely vaporized or almost completely vaporized. In other words, after heating, the byproducts are not contained or are contained only in very small amounts, in the first and/or second charge-generating layer.

Heating can be performed at a temperature of 80° C. to 220° C., preferably at 120° C. to 180° C., in particular at 120° C.

Heating can be performed for 10 seconds to 20 minutes. Preferably, the baking-out procedure is performed for 10 seconds to 120 seconds, particularly preferably 10 seconds to 60 seconds, e.g., 20 seconds.

The first charge-generating layer in method step D2) and the second charge-generating layer in method step D4) may be electron-conductive and/or hole-conductive. For example, the first charge-generating layer in method step D2) and the second charge-generating layer in method step D4) are electron-conductive.

The first and/or the second metal oxide may have different work functions. The term "work function" means the work that must be performed to release an electron from the metal oxide.

In method step B), an anode may be selected as the first electrode and in method step D1) a first electron-conductive metal oxide precursor is selected as the first metal oxide precursor and in method step D3) a second electron-conductive metal oxide precursor is selected as the second metal oxide precursor.

If an anode is selected as the first electrode, the work function of the first metal oxide can be equal to the LUMO (lowest unoccupied molecular orbital) of the light-emitting material of the first light-emitting layer. The work function of the second metal oxide can be equal to the HOMO (highest occupied molecular orbital) of the light-emitting material of the second light-emitting layer. If the light-emitting material of the first and the second light-emitting layer is the same light-emitting material, the work function of the first metal oxide can be less than that of the second metal oxide.

The fact that a work function is equal to a LUMO or HOMO means that the energy difference is at the most so great that an injection of the corresponding charge carriers can still take place.

In method step B), a cathode may be selected as the first electrode and in method step D1) a second electron-conductive metal oxide precursor is selected as the first metal oxide precursor and in method step D3) a first electron-conductive metal oxide precursor is selected as the second metal oxide precursor.

If a cathode is selected as the first electrode, the work function of the first metal oxide can be equal to the HOMO (highest occupied molecular orbital) of the light-emitting material of the first light-emitting layer. The work function of the second metal oxide can be equal to the LUMO (lowest unoccupied molecular orbital) of the light-emitting material of the second light-emitting layer. If the light-emitting material of the first and the second light-emitting layer is the same light-emitting material, the work function of the first metal oxide can be greater than that of the second metal oxide.

The fact that a cathode is selected as the electrode means that it can inject electrons into the adjoining layers. The fact that an anode is selected as the electrode means that it can inject holes into the adjoining layers.

An electron-conductive metal oxide precursor can itself be electron-conductive and/or can be converted by chemical reaction into an electron-conductive metal oxide.

A hole-conductive metal oxide precursor can itself be hole-conductive and/or can be converted by chemical reaction into a hole-conductive metal oxide.

If an electron-conductive metal oxide precursor is selected, a charge-generating layer can be generated which comprises an electron-conductive metal oxide and is thus electron-conductive, i.e., n-conductive.

If a hole-conductive metal oxide precursor is selected, a charge-generating layer can be generated which comprises a hole-conductive metal oxide and is thus hole-conductive, i.e., p-conductive. A hole-conductive metal oxide precursor can be used, e.g., in an alternative manner to the second electron-conductive metal oxide precursor.

A first electron-conductive metal oxide precursor may be selected from a group comprising ZnO-, SnO-, TiO$_2$-precursors or combinations thereof.

A second electron-conductive metal oxide precursor may be selected from a group comprising the V$_2$O$_5$-, Nb$_2$O$_5$-, Ta$_2$O$_5$-, MoO$_3$-, WO$_3$-precursors and combinations thereof.

If a ZnO-, an SnO-, and/or a TiO$_2$-precursor or combinations thereof is/are selected, a first or second charge-generating layer is produced which is electron-conductive, i.e. n-conductive.

If a V$_2$O$_5$-, Nb$_2$O$_5$-, Ta$_2$O$_5$-, MoO$_3$-, WO$_3$-precursor or combinations thereof is/are selected, a first or second charge-generating layer is produced which is electron-conductive, i.e. n-conductive.

The first electron-conductive metal oxide precursor may have formula A or A':

$R^1$, $R^2$, $R^3$, $R^4$, $R^5$ and $R^6$ can be selected to be the same or different and are selected from a group comprising H and alkyl residues. $M^1$=Zn or Sn. n=1 or 2.

The alkyl residues can be selected from a group comprising methyl, ethyl, n-propyl and i-propyl residues.

The solution of the first electron-conductive metal oxide precursor may be heated prior to method step D1) or prior to method step D3), to a temperature of 20° C. to 60° C.

The first organic layer stack may be heated prior to method step D1), or the first charge-generating layer is heated, prior to method step D3), to a temperature of 20° C. to 60° C. and in method step D1) or D3), the solution of the first electron-conductive metal oxide precursor is applied to the first organic layer stack which is at a temperature of 20° C. to 60° C., or the first charge-generating layer which is at a temperature of 20° C. to 60° C.

The solution of the first electron-conductive metal oxide precursor and the first organic layer stack may be heated prior to method step D1) to the same temperature, in particular to 50° C., or the solution of the first electron-conductive metal oxide precursor and the first charge-generating layer are heated prior to method step D3) to the same temperature, in particular 50° C.

Hydrolysis of the first electron-conductive metal oxide precursor may take place in method step D2) or D4).

The following may apply in formula A or A': $R^1$, $R^2$, $R^4$ and $R^5=CH_3$ and $R^3$ and $R^6=H$.

The following may apply in formula A or A': $M^1=Zn$.

The first electron-conductive metal oxide precursor may have formula A or A':

where $R^1$, $R^2$, $R^4$ and $R^5=CH_3$ and $R^3$ and $R^6=H$ and n=1 or 2.

The solution of the first electron-conductive metal oxide precursor can comprise a base. The base can be present in the solution in addition to a solvent. For example, the base can be triethylamine, ethanolamine or diethanolamine. Preferably, the base is ethanolamine.

The first electron-conductive metal oxide precursor may have formula A":

$R^7$ is selected from a group comprising methyl-, ethyl-, n-propyl, i-propyl, n-butyl-, i-butyl, sec-butyl and tert-butyl residues. Preferably $R^7$ is selected from a group comprising i-propyl, i-butyl-, sec-butyl and tert-butyl residues. Preferably, $R^7$ is an i-propyl residue.

If the first electron-conductive metal oxide precursor is a compound of formula A", ethanolamine, diethanolamine and/or acetylacetone can be contained in the solution of the first and/or second metal oxide precursor. Ethanolamine, diethanolamine and/or acetylacetone can be present in the solution in addition to a solvent. Preferably, the solution contains ethanolamine and acetylacetone, diethanolamine and acetylacetone or ethanolamine, diethanolamine and acetylacetone.

The second electron-conductive metal oxide precursor may have formula B, C or D:

where in formula B:

$R^{1'}$, $R^{2'}$ and $R^{3'}$ can be selected to be the same or different and are selected from a group comprising methyl-, ethyl-, n-propyl, i-propyl, n-butyl-, i-butyl, sec-butyl and tert-butyl residues and $M^2$=V, Nb or Ta;

where in formula C:

$R^{1''}$, $R^{2''}$, $R^{3''}$, $R^{4''}$ and $R^{5''}$ can be selected to be the same or different and are selected from a group comprising methyl-, ethyl-, n-propyl, i-propyl, n-butyl-, i-butyl, sec-butyl and tert-butyl residues and $M^3$=W or Mo;

and where in formula D:

$R^{1'''}$, $R^{2'''}$, $R^{3'''}$, $R^{4'''}$, $R^{5'''}$ and $R^{6'''}$ can be selected to be the same or different and are selected from a group comprising methyl-, ethyl-, n-propyl, i-propyl, n-butyl-, i-butyl, sec-butyl and tert-butyl residues and $M^4$=W or Mo.

Preferably, $R^{1'}$, $R^{2'}$ and $R^{3'}$ in formula B can be selected to be the same or different and are selected from a group comprising i-propyl, i-butyl, sec-butyl and tert-butyl residues. Preferably, $R^{1'}$, $R^{2'}$ and $R^{3'}$ are i-propyl residues.

Preferably, $R^{1''}$, $R^{2''}$, $R^{3''}$, $R^{4''}$ and $R^{5''}$ in formula C can be selected to be the same or different and are selected from a group comprising methyl, ethyl-, n-propyl and i-propyl residues. Preferably, $R^{1''}$, $R^{2''}$, $R^{3''}$, $R^{4''}$ and $R^{5''}$ are ethyl residues.

Preferably, $R^{1'''}$, $R^{2'''}$, $R^{3'''}$, $R^{4'''}$, $R^{5'''}$ and $R^{6'''}$ in formula D can be selected to be the same or different and are selected from a group comprising methyl, ethyl-, n-propyl and i-propyl residues. Preferably, $R^{1'''}$, $R^{2'''}$, $R^{3'''}$, $R^{4'''}$, $R^{5'''}$ and $R^{6'''}$ are ethyl residues.

The solution of the second electron-conductive metal oxide precursor and the first organic layer stack may be at room temperature in method step D1), or the solution of the second electron-conductive metal oxide precursor and the first charge-generating layer may be at room temperature in method step D3).

Hydrolysis of the second electron-conductive metal oxide precursor may take place in method step D2) or D4).

The second electron-conductive metal oxide precursor may have formula B:

where $M^2$=V.

The following may apply in formula B: $R^{1'}$, $R^{2'}$ and $R^{3'}$=i-propyl and $M^2$=V. The second electron-conductive metal oxide precursor thus has the following formula:

The second electron-conductive metal oxide precursor may have formula C:

where
$R^{1''}$, $R^{2''}$, $R^{3''}$, $R^{4''}$ and $R^{5''}$ are ethyl residues.
The second electron-conductive metal oxide precursor may have formula D:

where
$R^{1'''}$, $R^{2'''}$, $R^{3'''}$, $R^{4'''}$, $R^{5'''}$ and $R^{6'''}$ are ethyl residues and $M^4$=W.

In a method step prior to D1) the first metal oxide precursor may be dissolved in a first organic solvent and/or in a method step prior to D3) the second metal oxide precursor may be dissolved in a second organic solvent. The first and the second organic solvents can be selected independently of one another from a group comprising water, ethanol, 2-methoxyethanol, 2-propanol, 1-propanol, 1-butanol, 2-butanol and combinations thereof. The water can be distilled water. The alcohols can be distilled. Therefore, the first and/or second metal oxide precursor is/are present in solution and therefore in a liquid phase and can be applied in this form in method steps D1) and/or D3).

The first organic solvent can be completely vaporized or almost completely vaporized in method step D2) and/or the second organic solvent can be completely vaporized or almost completely vaporized in method step D4). In other words, the organic solvents are not contained, or are contained at least only in a very small amount, in the first and/or second charge-generating layer.

For example, the second electron-conductive metal oxide precursor can be vanadium(V)oxytriisopropoxide. The volume ratio of vanadium(V)oxytriisopropoxide to the first or second organic solvent can be 1:80 to 1:200, preferably 1:100 in method step D1) or D3). The solvent can be isopropanol.

For example, the first electron-conductive metal oxide precursor can be zinc acetylacetonate dihydrate or zinc acetylacetonate hydrate. The concentration of the solution of zinc acetylacetonate dihydrate or zinc acetylacetonate hydrate can, in method step D1) or in method step D3), be 10 to 30 mg zinc acetylacetonate dihydrate or zinc acetylacetonate hydrate per 1 ml of the first or second organic solvent. Preferably, the concentration can be 15 to 25 mg/ml, particularly preferably 20 mg/ml. The solvent can be ethanol or 2-methoxyethanol.

For example, the first electron-conductive metal oxide precursor can be zinc acetylacetonate. For example, water and ethanol or water and 2-methoxyethanol can then be selected as the solvent. The solution can consist of zinc acetylacetonate, water and ethanol or of zinc acetylacetonate, water and 2-methoxyethanol.

It is also possible that the first electron-conductive metal oxide precursor is zinc acetylacetonate and comprises or consists of the solution of zinc acetylacetonate, ethanolamine and 2-methoxyethanol.

The first and/or the second electrode may be transparent. The first or second electrode can each be electrically connected as an anode or as a cathode in the optoelectronic device produced by the method. If the optoelectronic device is an organic light-emitting device, then light thus produced in the first and second organic layer stack can be radiated outwards via the anode and/or the cathode.

A transparent electrode consisting of or comprising a transparent conductive oxide may be applied. Transparent conductive oxides (TCOs) are transparent, conductive materials, generally metal oxides such as, for example, zinc oxide, tin oxide, cadmium oxide, titanium oxide, indium oxide or indium-tin oxide (ITO).

In addition to binary metal-oxygen compounds such as, e.g., ZnO, $SnO_2$ or $In_2O_3$, ternary metal-oxygen compounds such as, e.g., AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs and can be used in various examples. Furthermore, the TCOs do not necessarily correspond to a stoichiometric composition and may also be p- or n-doped.

Furthermore, a metallic electrode can be attached as the transparent electrode. The metallic electrode may comprise, e.g., a metal selected from aluminum, barium, indium, silver, gold, magnesium, calcium, samarium, germanium, zinc, copper, indium, tin and lithium as well as compounds, combinations and alloys thereof. The metallic electrode has such a small thickness that it is at least partially transmissive to light. In various examples, the transparent electrode can be formed from a layer stack of a combination of a layer of a metal on a layer of a TCO, or vice versa. One example is a silver layer applied on an indium-tin-oxide layer (ITO) (Ag on ITO) or ITO-Ag-ITO multiple layers. In this case, a further metal growth layer containing germanium or consisting of germanium can be applied as a wetting promoter to the first ITO layer to improve the homogeneous deposition, e.g., of Ag as a layer of the layer stack of the transparent electrode of the layer sequence.

In various examples, one or more of the following materials can be applied as the transparent electrode as an alternative to or in addition to the aforementioned materials: Networks of metallic nanowires and nanoparticles, e.g., of Ag, networks of carbon nanotubes; graphene particles and layers and networks of semiconductive nanowires.

If only one of the first and second electrodes is transparent, the other electrode is preferably reflective. The reflective electrode is preferably a metallic electrode and may comprise, e.g., a metal selected from aluminum, barium, indium, silver, gold, magnesium, calcium, germanium, samarium, zinc, copper, indium, tin and lithium as well as compounds, combinations and alloys thereof. Alternatively or in addition, the reflective electrode can also comprise one or more of the aforementioned transparent conductive oxides.

A plurality of layers can be applied for the reflective electrode. For example, it can be a layer stack of a plurality of layers of the same metal or of different metals and/or the same TCO or different TCOs. For example, the reflective electrode comprises at least one layer of a transparent conductive oxide and at least one metallic layer.

If the first electrode is formed in method step B) to be reflective and the second electrode is formed in method step F) to be transparent, then—if the optoelectronic device is an organic light-emitting device—the generated light of the first and second organic layer stack of an organic light-emitting device produced in this manner is radiated upwards via the second electrode and the organic light-emitting device is designed as a so-called "top-emitter".

The substrate may be in the form of a layer, a plate, a film or a laminate. The layer, plate, film or laminate can comprise or consist of glass, quartz, synthetic material, metal, silicon wafer or combinations of said materials.

The substrate may be transparent. Therefore, if the first electrode is transparent, generated light of the first and second organic layer stack can be radiated through the substrate. The organic light-emitting device produced by the method, e.g., an OLED can thus be produced as a so-called "bottom emitter". It is also possible that a "transparent OLED" is produced if, in addition, the second electrode is transparent and the light emission can be effected both downwards through a transparent first electrode and a transparent substrate and upwards through a transparent second electrode.

Method step C) and/or E) may comprise applying layers having organic polymers, organic oligomers, organic monomers, organic small non-polymeric molecules ("small molecules") or combinations thereof.

Method step C) may comprise a method step C2) of applying a first light-emitting layer to the first electrode. Method step C) can also consist of method step C2). The first light-emitting layer can comprise a light-emitting material.

Method step E) may comprise a method step E2) of applying a second light-emitting layer on the charge-generating layer stack. Method step E) can also consist of method step E2). The second light-emitting layer can comprise a light-emitting material.

The first and/or second light-emitting layer can be formed from organic polymers, organic oligomers, organic monomers, organic small non-polymeric molecules ("small molecules") or combinations thereof. Furthermore, the first and/or second light-emitting layer can be formed as an electroluminescent layer. Suitable materials for this purpose are light-emitting materials which have a radiation emission by reason of fluorescence or phosphorescence. Preferably, the first and/or second light-emitting layer comprise(s) organic small non-polymeric molecules. When polymers or oligomers are used in the first and/or second light-emitting layer, there is the risk that they will be dissolved by the solvent with which the layer arranged above the first and/or second light-emitting layer is applied.

If combinations of light-emitting materials are present in the first and/or second light-emitting layer, it is possible that the light-emitting materials in the first and/or second light-emitting layer are distributed homogeneously in the light-emitting layer.

The light-emitting materials of the first and second light-emitting layers may be selected such that superposition of the emitted radiation of the light-emitting materials gives the impression of white light.

The method may comprise a further method step E') of applying a third organic layer stack on the second organic layer stack. In particular, the third organic layer stack is applied on the second charge-generating layer stack. Selection of the materials suitable for the third organic layer stack and/or the production can be the same as stated for the first and second organic layer stacks.

Method step E') may comprise a method step E2') of applying a third light-emitting layer to the second charge-generating layer stack. Method step E') can also consist of method step E2'). Selection of the materials suitable for the third light-emitting layer can be the same as already stated above for the first and second light-emitting layers.

It is possible that in addition to the first, second and third organic layer stacks, further organic layer stacks are formed. All of the features of production of the first, second and third organic layer stacks can also apply to the further organic layer stacks. The further organic layer stacks can be formed between two charge-generating layer stacks or between one charge-generating layer stack and the second electrode.

The first and second light-emitting layers or the first, second and third light-emitting layers may comprise the same light-emitting materials. For instance, the color intensity of the radiation emitted by the organic light-emitting device can be increased within the desired spectral range.

The first and second light-emitting layers or the first, second and third light-emitting layers may comprise different light-emitting materials. It is possible that the first and the second light-emitting layers or the first, second and third light-emitting layers comprise different materials which, however, emit radiation in the same wavelength range of the electromagnetic spectrum. The term "same" means that the emission bands partially overlap but do not have to be identical. For instance, the color intensity can be increased within the desired, e.g., blue spectral range.

The first and the second light-emitting layers or the first, second and third light-emitting layers preferably comprise different light-emitting materials that emit radiation in different wavelength ranges of the electromagnetic spectrum. For example, a light-emitting material of the first light-emitting layer has a radiation emission in the blue wavelength range and a light-emitting material of the second light-emitting layer has a radiation emission in the yellow wavelength range. For example, a light-emitting material of the first light-emitting layer can also have a radiation emission in the blue wavelength range, a light-emitting material of the second light-emitting layer can have a radiation emission in the red wavelength range and a light-emitting material of the third light-emitting layer can have a radiation emission in the green wavelength range. However, all other feasible combinations are also possible.

The light-emitting materials of the first and second layers or the first, second and third layers may be selected such that superposition of the emitted radiation of the light-emitting materials of the first and second light-emitting layers or the first, second and third light-emitting layers gives an impression of white light.

The first and second light-emitting layers or the first and third light-emitting layers or the second and third light-emitting layers may comprise the same light-emitting materials.

Method step C) and/or E) may comprise applying charge transport layers such as electron transport layers and/or hole transport layers.

Method step C) may comprise a method step C1) of applying a charge transport layer to the first electrode. If in method step B) a cathode is selected as the first electrode, then an electron transport layer is applied in C1). If in method step B) an anode is selected as the first electrode, then a hole transport layer is applied in C1). Method step C) can consist of method steps C1) and C2).

Method step C) may comprise a method step C3) of applying a charge transport layer to the first light-emitting layer. If in method step B) a cathode is selected as the first electrode, then a hole transport layer is applied in C3). If in method step B) an anode is selected as the first electrode, then an electron transport layer is applied in C3). Method step C) can consist of method steps C1), C2) and C3).

Method step E) may comprise a method step E1) of applying a charge transport layer to the charge-generating layer sequence. If in method step B) a cathode is selected as the first electrode, then an electron transport layer is applied in E1). If in method step B) an anode is selected as the first electrode, then a hole transport layer is applied in E1). Method step E) can consist of method steps E2) and E1).

Method step E) may comprise a method step E3) of applying a charge transport layer to the second light-emitting layer. If in method step B) a cathode is selected as the first electrode, then a hole transport layer is applied in E3). If in method step B) an anode is selected as the first electrode, then an electron transport layer is applied in E3). Method step E) can consist of method steps E1), E2) and E3).

For example, liq (8-hydroxyquinolinolato-lithium), TPBi (2,2',2''-(1,3,5-benzintriyl)-tris(1-phenyl-1-H-benzimidazole)), PBD (2-(4-biphenylyl)-5-(4-tert-butylphenyl)), BCP (2,9-dimethyl-4,7-diphenyl-1,10-phenanthroline), BPhen (4,7-diphenyl-1,10-phenanthroline), BAlq (bis-2-methyl-8-quinolinolate)-4-(phenylphenolato)aluminum) and mixtures of the aforementioned substances can be named as electron transport materials.

For example, PEDOT:PSS (with polystyrene sulfonate-doped poly-3,4-ethylene dioxythiophene), NPB (N,N'-bis (naphthalene-1-yl)-N,N'-bis(phenyl)-benzidine, β-NPB (N,N'-bis(naphthalene-2-yl)-N,N'-bis(phenyl)-benzidine), TPD (N,N'-bis(3-methylphenyl)-N,N'-bis(phenyl)-benzidine), spiro-TPD (N,N'-bis(3-methylphenyl)-N,N'-bis(phenyl)-benzidine), spiro-NPB (N,N'-bis(naphthalene-1yl)-N,N'-bis(phenyl)-spiro), DMFL-TPD (N,N'-bis(3-methylphenyl)-N,N'-bis(phenyl)-9,9-dimethylfluorene, DMFL-NPB (N,N'-bis(naphthalen-1-yl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphthalene-1-yl)-N,N'-bis(phenyl)-9,9-diphenylfluorene), spiro-TAD (2,2',7,7'-tetrakis(n,n-diphenylamino)-9,9'-spirobifluorene) or mixtures of the aforementioned substances can be named as hole transport materials.

The method may comprise a method step G): G) applying an encapsulation to the second electrode.

For example, a synthetic material layer can be applied and/or a glass layer can be laminated-on as the encapsulation.

An optoelectronic device is provided. The optoelectronic device comprises a substrate, a first electrode on the substrate, a first organic layer stack on the first electrode, a charge-generating layer stack on the first organic layer stack, wherein the charge-generating layer stack comprises a first charge-generating layer comprising ZnO and a second charge-generating layer comprising $V_2O_5$, a second organic layer stack on the charge-generating layer stack and a second electrode on the second organic layer stack.

ZnO has a work function of 4.1 eV and $V_2O_5$ has a work function of 6.7 eV. By this difference in the work function, an optimum charge transport and thus a high level of efficiency can be achieved in the optoelectronic device.

The optoelectronic device can be formed as an organic light-emitting device, e.g., as an organic light-emitting diode (OLED) or as a solar cell.

The first charge-generating layer may consist of ZnO and/or the second charge-generating layer may consist of $V_2O_5$.

The first organic layer stack may comprise a first light-emitting layer comprising a light-emitting material.

The second organic layer stack may comprise a second light-emitting layer comprising a second light-emitting material.

The first and second light-emitting materials may be identical.

The charge-generating layer stack may consist of the first and second charge-generating layers.

In particular, the optoelectronic device comprises each feature and each combination of features stated with regard to the method of producing an optoelectronic device.

Further advantages and developments are apparent from the examples described below in conjunction with the figures.

Identical, similar elements or elements acting in an identical manner are provided with the same reference numerals in the figures. The figures and the size ratios of the elements with respect to each other, as illustrated in the figures, are not to be considered as being to scale. Rather, individual elements can be illustrated excessively large for improved clarity and/or improved understanding.

Figure 1:
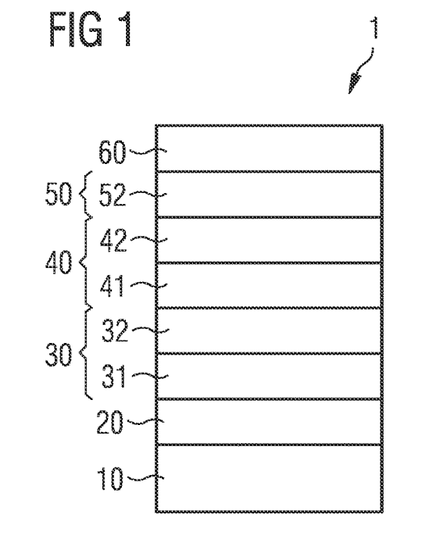
FIGS. 1 and 3 show schematic side views of examples of an organic light-emitting device.

FIG. 1 shows an example of an organic light-emitting device 1. The device comprises a substrate 10, a first electrode 20, a first organic layer stack 30, a charge-generating layer stack 40, a second organic layer stack 50 and a second electrode 60. The first electrode 20 is an ITO anode and the substrate 10 is a glass substrate. Arranged on the anode is a charge transport layer 31, in this case a hole transport layer consisting of PEDOT:PSS. Arranged above the hole transport layer is a first light-emitting layer 32. The first light-emitting layer 32 consists of a polymer that emits yellow light and has the following structure:

The first light-emitting layer 32 is followed by a first charge-generating layer 41 consisting of ZnO, followed by a second charge-generating layer 42 consisting of $V_2O_5$. A second light-emitting layer 52 follows and is constructed identically to the first light-emitting layer 32. Arranged above the second light-emitting layer 52 is a second electrode 60 designed as a cathode. The cathode is formed from a ca. 0.7 nm thick LiF layer and a 200 nm thick Al layer.

FIG. 1 shows that for this organic light-emitting device, with the same current flowing through compared to conventional devices without a charge-generating layer stack and with only one light-emitting layer, twice the light yield is achieved at a predetermined level of current.

The organic light-emitting device illustrated in FIG. 1 was produced by the following method steps:
A) providing a substrate (10),
B) applying a layer of ITO as the first electrode (20) to the substrate (10),
cleaning the ITO layer
C1) applying PEDOT:PSS by centrifugation onto the first electrode (20) at 4000 revolutions per minute for 55 s at an acceleration of 500 rpm/s.
C2) applying by centrifugation the yellow emitter of the following structure dissolved in toluene at 1000 revolutions per minute for 60 s at an acceleration of 500 rpm/s.

D) producing a charge-generating layer stack (40) on the first organic layer stack (30), comprising the method steps of:
filtering a solution of zinc acetylacetonate hydrate in ethanol (concentration: 20 mg/ml) through a 22 µm filter,
D1) applying by centrifugation the filtered solution of zinc acetylacetonate hydrate, which is heated to 50° C., in ethanol at a concentration of 20 mg/ml at 2000 revolutions per minute for 50 s onto the first organic layer stack (30) having been heated to 50° C.,
D2) generating a first charge-generating layer (41) consisting of ZnO by heating the solution for 30 seconds at 120° C.

D3) applying by centrifugation a solution of vanadium(V) oxytriisopropoxide in isopropanol (volume ratio of vanadium(V)oxytriisopropoxide:isoporopanol=1:100) at 2000 revolutions per minute for 50 s onto the first charge-generating layer (41)
D4) generating a second charge-generating layer (42) consisting of $V_2O_5$ by heating the solution for 60 seconds at 120° C.
E2) applying by centrifugation the yellow emitter from C2) dissolved in toluene at 1000 revolutions per minute for 60 s on the charge-generating layer stack (40),
F) applying a second electrode (60) as a cathode on the second organic layer stack (50) by thermal vaporization of LiF and Al.

A charge-generating layer stack as described with reference to FIG. 1 can also be present in a solar cell (not shown here).

Figure 2:
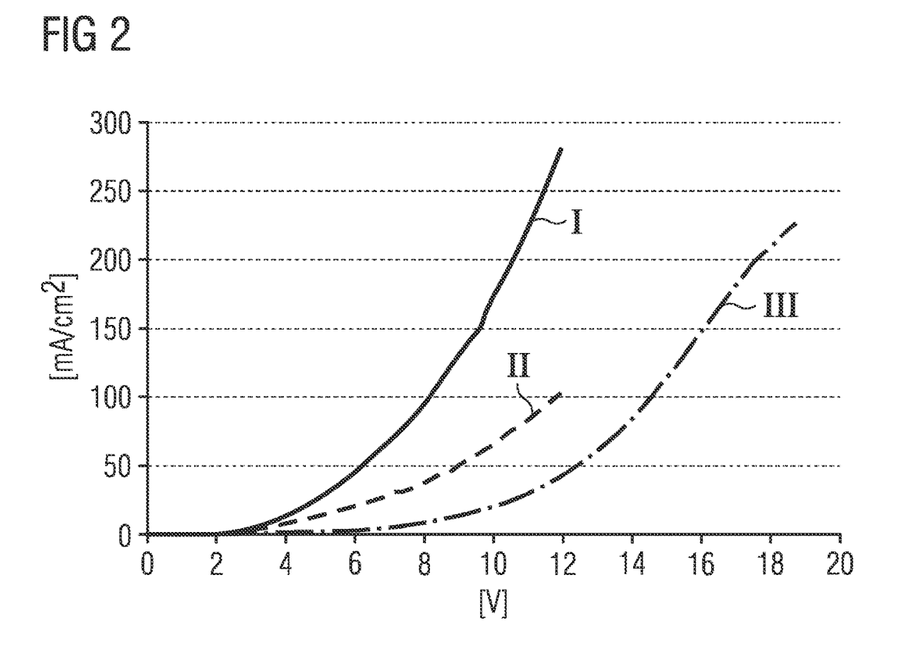
FIG. 2 shows current density-voltage characteristic curves of different organic light-emitting devices.

FIG. 2 shows the current density-voltage characteristic curves of various organic light-emitting devices. The x-axis plots the voltage in V (volts) and the y-axis plots the current density in $mA/cm^2$ (milliampere per $cm^2$). The characteristic curve designated by the reference numeral III is that of the organic light-emitting device 1 of FIG. 1. In comparison therewith, the characteristic curves II and I are assigned to organic light-emitting devices constructed as follows:

The device relating to characteristic curve II: glass substrate, ITO anode, PEDOT:PSS, light-emitting layer consisting of a ZnO layer and an Al layer. This is a bottom emitter.

The device relating to characteristic curve I: reflective anode, $V_2O_5$ layer, light-emitting layer consisting of an LiF layer and an Al layer. This is a top emitter. The device assigned the characteristic curve III can thus be obtained by "stacking" the devices of characteristic curves I and II one on top of the other, wherein the Al layer of the device of characteristic curve II and the reflective anode of the device of characteristic curve I are omitted. Ideally, the current density-voltage characteristic curve III is the sum of characteristic curves II and I. For example, FIG. 2 shows in a current density of 50 mA/cm², a voltage of characteristic curve I of ca. 6 V, characteristic curve I of ca. 9 V and characteristic curve III of ca. 13 V. The optimum value of characteristic curve III is 15 V. The current density-voltage characteristic curve has been recorded using a "source measurement unit, Keithley 238".

Figure 3:
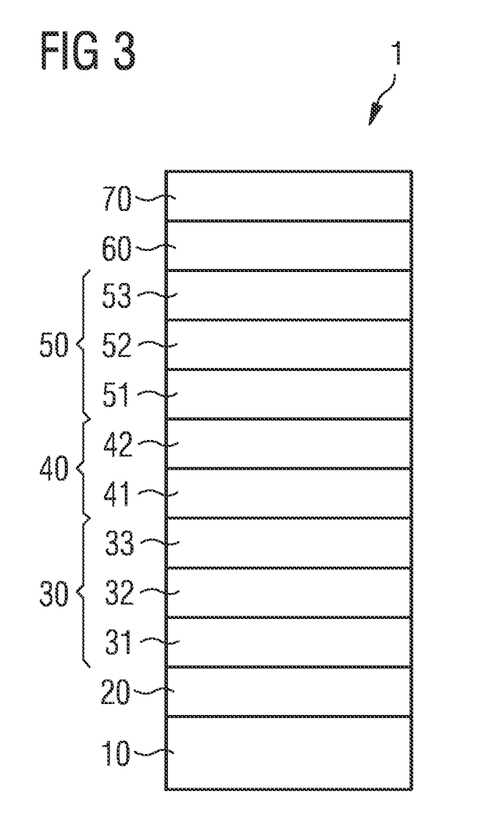

FIG. 3 shows an example of an organic light-emitting device 1. The device comprises a substrate 10, a first electrode 20, a first organic layer stack 30, a charge-generating layer stack 40, a second organic layer stack 50, a second electrode 60 and an encapsulation 70. The substrate 10 can be a glass substrate. The first electrode 20 can be an ITO anode. Arranged on the anode is a charge transport layer 31, in this case a hole transport layer, e.g., consisting of PEDOT:PSS. Arranged above the hole transport layer is a first light-emitting layer 32. The first light-emitting layer 32 emits, e.g., blue light. Arranged on the first light-emitting layer 32 is a charge transport layer 33, in this case an electron transport layer such as, e.g., BCP. The layers 31, 32 and 33 form the first organic layer stack 30. The subsequent charge-generating layer stack 40 consists of a first charge-generating layer 41, e.g., consisting of ZnO, SnO or TiO₂ and a second charge-generating layer 42, e.g., consisting of V₂O₅, Nb₂O₅, Ta₂O₅, MoO₃ or WO₃. Arranged above the charge-generating layer stack 40 is a second organic layer stack 50 consisting of a charge transport layer 51, in this case a hole transport layer such as, e.g., PEDOT:PSS, a second light-emitting layer 52 and a charge transport layer 53, in this case an electron transport layer such as BCP. The second light-emitting layer 52 emits, e.g., yellow light. Arranged above the second organic layer stack 50 is a second electrode 60 and an encapsulation 70 consisting, e.g., of a synthetic material layer. The second electrode 60 is designed as a cathode and consists, e.g., of a metal layer.

The organic light-emitting device 1 in accordance with FIG. 3 can emit light downwards via the substrate 10 and upwards via the second electrode 60 if the second electrode 60 is transparent. By superpositioning the blue and yellow light, white light can be radiated outwardly.

The description made with reference to the examples does not restrict this disclosure to these examples. Rather, the disclosure encompasses any new feature and any combination of features, including in particular any combination of features in the appended claims, even if the feature or combination is not itself explicitly indicated in the claims or examples.

This patent application claims priority of DE 102013109451.1, the subject matter of which is hereby incorporated by reference.

The invention claimed is:

1. A method of producing an optoelectronic device comprising:
   A) providing a substrate,
   B) applying a first electrode to the substrate,
   C) applying a first organic layer stack to the first electrode,
   D) producing a charge-generating layer stack on the first organic layer stack,
   E) applying a second organic layer stack to the charge-generating layer stack,
   F) applying a second electrode to the second organic layer stack,
   wherein step D) comprises:
   D1) applying a solution of a first metal oxide precursor to the first organic layer stack, wherein the solution of the first metal oxide precursor and the first organic layer have the same temperature between 30° C. to 60° C. and the solution of the first metal oxide precursor and the first organic layer stack are heated, prior to step D1) to the same temperature of 30° C. to 60° C.,
   D2) generating a first charge-generating layer comprising a first metal oxide,
   D3) applying a solution of a second metal oxide precursor to the first charge-generating layer, wherein the solution of the second metal oxide precursor and the first charge-generating layer have a temperature of 30° C. to 60° C. and the solution of the second metal oxide precursor and the first charge-generating layer are heated, prior to step D3), to the same temperature of 30° C. to 60° C.,
   D4) generating a second charge-generating layer comprising a second metal oxide.

2. The method according to claim 1, wherein a solution of the first metal oxide precursor is applied in step D1) by coating methods, spin-coating, spraying or printing methods and/or a solution of the second metal oxide precursor is applied in step D3) by coating methods, spin-coating, spraying or printing methods.

3. The method according to claim 1, wherein a solution of the first metal oxide precursor is filtered prior to step D1) and/or a solution of the second metal oxide precursor is filtered prior to step D3).

4. The method according to claim 1, wherein in step B) an anode is selected as the first electrode and in step D1) a first electron-conductive metal oxide precursor is selected as the first metal oxide precursor and in step D3) a second electron-conductive metal oxide precursor is selected as the second metal oxide precursor or wherein in step B) a cathode is selected as the first electrode and in step D1) a second electron-conductive metal oxide precursor is selected as the first metal oxide precursor and in step D3) a first electron-conductive metal oxide precursor is selected as the second metal oxide precursor.

5. The method according to claim 4, wherein the first electron-conductive metal oxide precursor is selected from the group consisting of ZnO-, SnO-, TiO₂-precursors or combinations thereof, and wherein the second electron-conductive metal oxide precursor is selected from the group consisting of V₂O₅-, Nb₂O₅-, Ta₂O₅-, MoO₃-, WO₃-precursors and combinations thereof.

6. The method according to claim 4, wherein the first electron-conductive metal oxide precursor has formula A or A':

where $R^1$, $R^2$, $R^3$, $R^4$, $R^5$ and $R^6$ can be selected to be the same or different and are selected from the group consisting of H and alkyl residues, $M^1$=Zn or Sn and n=1 or 2.

7. The method according to claim 6, wherein $R^1$, $R^2$, $R^4$ and $R^5$=CH$_3$ and $R^3$ and $R^6$=H.

8. The method according to claim 7, wherein $M^1$=Zn.

9. The method according to claim 4, wherein the second electron-conductive metal oxide precursor has one of formulae B, C or D:

where in formula B:
$R^{1\prime}$, $R^{2\prime}$ and $R^{3\prime}$ can be selected to be the same or different and are selected from the group consisting of methyl-, ethyl-, n-propyl, i-propyl, n-butyl-, i-butyl, sec-butyl and tert-butyl residues and
$M^2$=V, Nb or Ta,
where in formula C:
$R^{1\prime\prime}$, $R^{2\prime\prime}$, $R^{3\prime\prime}$, $R^{4\prime\prime}$ and $R^{5\prime\prime}$ can be selected to be the same or different and are selected from the group consisting of methyl-, ethyl-, n-propyl, i-propyl, n-butyl-, i-butyl, sec-butyl and tert-butyl residues and
$M^3$=W or Mo,
and where in formula D:
$R^{1\prime\prime\prime}$, $R^{2\prime\prime\prime}$, $R^{3\prime\prime\prime}$, $R^{4\prime\prime\prime}$, $R^{5\prime\prime\prime}$ and $R^{6\prime\prime\prime}$ can be selected to be the same or different and are selected from the group consisting of methyl-, ethyl-, n-propyl, i-propyl, n-butyl-, i-butyl, sec-butyl and tert-butyl residues and
$M^4$=W or Mo.

10. The method according to claim 9, where the second electron-conductive metal oxide precursor has formula B:

where $M^2$=V.

11. The method according to claim 10, wherein $R^{1\prime}$, $R^{2\prime}$ and $R^{3\prime}$=i-propyl.

12. The method according to claim 1, wherein in a step prior to D1) the first metal oxide precursor is dissolved in a first organic solvent and in a step prior to D3) the second metal oxide precursor is dissolved in a second organic solvent and wherein the first and second organic solvents are selected independently of one another from the group consisting of water, ethanol, 2-methoxyethanol, 2-propanol, 1-propanol, 1-butanol, 2-butanol and combinations thereof.

13. A method of producing an optoelectronic device comprising:
A) providing a substrate,
B) applying an anode to the substrate,
C) applying a first organic layer stack to anode,
D) producing a charge-generating layer stack on the first organic layer stack,
E) applying a second organic layer stack to the charge-generating layer stack,
F) applying a cathode to the second organic layer stack,
wherein step D) comprises:
D1) applying a solution of a first electron-conductive metal oxide precursor to the first organic layer stack, wherein the solution of the first metal oxide precursor and the first organic layer have the same temperature of 30° C. to 60° C. and the solution of the first metal oxide precursor and the first organic layer stack are heated, prior to step D1) to the same temperature of 30° C. to 60° C. and wherein the first electron-conductive metal oxide precursor has formula A or A':

where $R^1$, $R^2$, $R^3$, $R^4$, $R^5$ and $R^6$ can be selected to be the same or different and are selected from the group consisting of H and alkyl residues, $M^1$=Zn or Sn and n=1 or 2, D2) generating a first charge-generating layer comprising a first metal oxide,
D3) applying a solution of a second electron-conductive metal oxide precursor to the first charge-generating layer, wherein the solution of the second metal oxide precursor and the first charge-generating layer have a temperature of 30° C. to 60° C. and the solution of the second metal oxide precursor and the first charge-generating layer are heated, prior to step D3), to the same temperature of 30° C. to 60° C. and wherein the second electron-conductive metal oxide precursor has one of formulae B, C or D:

-continued

C

D where in formula B:
R$^{1'}$, R$^{2'}$ and R$^{3'}$ can be selected to be the same or different and are selected from the group consisting of methyl-, ethyl-, n-propyl, i-propyl, n-butyl-, i-butyl, sec-butyl and tert-butyl residues and
M$^2$=V, Nb or Ta, where in formula C:
R$^{1''}$, R$^{2''}$, R$^{3''}$, R$^{4''}$ and R$^{5''}$ can be selected to be the same or different and are selected from the group consisting of methyl-, ethyl-, n-propyl, i-propyl, n-butyl-, i-butyl, sec-butyl and tert-butyl residues and
M$^3$=W or Mo, and where in formula D:
R$^{1'''}$, R$^{2'''}$, R$^{3'''}$, R$^{4'''}$, R$^{5'''}$ and R$^{6'''}$ can be selected to be the same or different and are selected from the group consisting of methyl-, ethyl-, n-propyl, i-propyl, n-butyl-, i-butyl, sec-butyl and tert-butyl residues and
M$^4$=W or Mo, D4) generating a second charge-generating layer comprising a second metal oxide.

14. The method according to claim 13, wherein the second charge-generating layer is generated directly on the first charge-generating layer.

* * * * *